United States Patent
Harrison et al.

Patent Number: 5,166,126
Date of Patent: Nov. 24, 1992

[54] COLOR FILTER ARRAY ELEMENT WITH PROTECTIVE OVERCOAT LAYER AND METHOD OF FORMING SAME

[75] Inventors: Daniel J. Harrison, Pittsford; Mary Catherine S. Oldfield, Rochester, both of N.Y.

[73] Assignee: Eastman Kodak Company, Rochester, N.Y.

[21] Appl. No.: 838,620

[22] Filed: Feb. 19, 1992

[51] Int. Cl.$^5$ .................. B41M 5/035; B41M 5/38
[52] U.S. Cl. .................... 503/227; 427/265; 427/266; 428/195; 428/203; 428/210; 428/412; 428/413; 428/473.5; 430/7; 430/200; 430/201; 359/885
[58] Field of Search ............ 8/471; 428/195, 210, 428/412, 913, 914, 203, 473.5; 503/227; 350/311; 427/265, 266; 430/7, 200, 201, 945

[56] References Cited

U.S. PATENT DOCUMENTS

| | | | |
|---|---|---|---|
| 3,794,576 | 2/1974 | Watt | 503/227 |
| 3,936,557 | 2/1976 | Watt | 503/227 |
| 4,058,401 | 11/1977 | Crivello | 503/227 |
| 4,069,055 | 1/1978 | Crivello | 503/227 |
| 4,161,478 | 7/1979 | Crivello | 503/227 |
| 4,310,469 | 1/1982 | Crivello | 503/227 |
| 4,374,066 | 2/1983 | Crivello et al. | 503/227 |
| 4,442,197 | 4/1984 | Crivello et al. | 503/227 |
| 4,684,671 | 8/1987 | Tsuchiya et al. | 503/227 |
| 4,835,193 | 5/1989 | Hayase et al. | 503/227 |
| 4,874,798 | 10/1989 | Koleske et al. | 503/227 |
| 4,902,669 | 2/1990 | Matsuda et al. | 503/227 |

FOREIGN PATENT DOCUMENTS

| | | | |
|---|---|---|---|
| 828670 | 9/1975 | Belgium | 503/227 |
| 207893 | 1/1987 | European Pat. Off. | 503/227 |
| 3035807 | 4/1981 | Fed. Rep. of Germany | 503/227 |
| 58-217516 | 12/1983 | Japan | 503/227 |
| 62-021150 | 1/1987 | Japan | 503/227 |
| 2-022652 | 1/1990 | Japan | 503/227 |
| 2-107630 | 4/1990 | Japan | 503/227 |

*Primary Examiner*—B. Hamilton Hess
*Attorney, Agent, or Firm*—Harold E. Cole

[57] ABSTRACT

A color filter array element, preferably for use in a color electro-optical display device such as a color liquid crystal display device, comprises a support having thereon a thermally transferred image comprising a repeating pattern of colorants and, overlying the transferred image, a protective overcoat layer that is produced by polymerization of an overcoat layer containing a cycloaliphatic epoxide compound and a photoinitiator that is an onium salt of a Lewis acid.

20 Claims, 1 Drawing Sheet

COLOR FILTER ARRAY ELEMENT WITH PROTECTIVE OVERCOAT LAYER AND METHOD OF FORMING SAME

CROSS-REFERENCE TO RELATED APPLICATION

Reference is made to applicants' copending application Ser. No. 07/838,624, entitled "Method of Forming Color Filter Array Element with Patternable Overcoat Layer," filed concurrently herewith.

FIELD OF THE INVENTION

This invention relates to a color filter array element and, more Particularly, to a color filter array element in which a protective overcoat layer overlies the transferred image in the dye image-receiving layer.

BACKGROUND OF THE INVENTION

In recent years, thermal transfer systems have been developed to obtain prints from pictures which have been generated electronically from a color video camera. According to one way of obtaining such prints, an electronic picture is first subjected to color separation by color filters. The respective color-separated images are then converted into electrical signals. These signals are then operated on to produce cyan, magenta and yellow electrical signals, which are then transmitted to a thermal printer. To obtain the print, a cyan, magenta or yellow dye-donor element is placed face-to-face with a dye-receiving element. The two are then inserted between a thermal printing head and a platen roller. A line-type thermal printing head is used to apply heat from the back of the dye-donor sheet. The thermal printing head has many heating elements and is heated up sequentially in response to the cyan, magenta and yellow signals. The process is then repeated for the other two colors. A color hard copy is thus obtained which corresponds to the original picture viewed on a screen. Further details of this process and an apparatus for carrying it out are contained in U.S. Pat. No. 4,621,271, the disclosure of which is hereby incorporated by reference.

Another way to obtain a thermal transfer print using the electronic signals described above is to use a laser instead of a thermal printing head. In such a system, the donor sheet includes a material that strongly absorbs at the wavelength of the laser. When the donor is irradiated, this absorbing material converts light energy to thermal energy and transfers the heat to the dye in the immediate vicinity, thereby heating the dye to its vaporization temperature for transfer to the receiver. The absorbing material may be present in a layer beneath the dye and/or it may be admixed with the dye. The laser beam is modulated by electronic signals that are representative of the shape and color of the original image, so that each dye is heated to cause volatilization only in those areas in which its presence is required on the receiver to reconstruct the color of the original object. Further details of this Process are found in GB No. 2,083,726A.

Liquid crystal display devices are known for digital display in electronic calculators, clocks, household appliances, audio equipment, etc. Liquid crystal displays are being developed to replace cathode ray tube technology for display terminals. Liquid crystal displays occupy a smaller volume than cathode ray tube devices with the same screen area. In addition, liquid crystal display devices usually have lower Power requirements than corresponding cathode ray tube devices.

There has been a need to incorporate a color display capability into such monochrome display devices, particularly in such applications as peripheral terminals using various kinds of equipment involving phototube display, mounted electronic display, or TV-image display. Various attempts have been made to incorporate a color display using a color filter array element into these devices. However, none of the color array elements for liquid crystal display devices so far proposed have been successful in meeting all the users needs.

One commercially available type of color filter array element that has been used in liquid crystal display devices for color display capability is a transparent support having a gelatin layer thereon which contains dyes having the additive primary colors red, green and blue in a mosaic pattern obtained by using a photolithographic technique. To prepare such a color filter array element, a gelatin layer is sensitized, exposed to a mask for one of the colors of the mosaic pattern, developed to harden the gelatin in the exposed areas, and washed to remove the unexposed (uncrosslinked) gelatin, thus producing a pattern of gelatin which is then dyed with dye of the desired color. The element is then recoated and the above steps are repeated to obtain the other two colors. Misalignment or improper deposition of color materials may occur during any of these operations. This method therefore contains many labor-intensive steps, requires careful alignment, is time-consuming and very costly. Further details of this process are disclosed in U.S. Pat. No. 4,081,277. U.S. Pat. No. 4,786,148 also discloses a color filter array element that employs certain pigments.

Color liquid crystal display devices generally include two spaced glass panels which define a sealed cavity that is filled with a liquid crystal material. For actively-driven devices, a transparent electrode is formed on one of the glass panels, which electrode may be patterned or not, while individually addressable electrodes are formed on the other of the glass panels. Each of the individual electrodes has a surface area corresponding to the area of one picture element or pixel. If the device is to have color capability, each pixel must be aligned with a color area, e.g., red, green or blue, of a color filter array. Depending upon the image to be displayed, one or more of the pixel electrodes is energized during display operation to allow full light, no light or partial light to be transmitted through the color filter area associated with that pixel. The image Perceived by a user is a blending of colors formed by the transmission of light through adjacent color filter areas.

In forming such a liquid crystal display device, the color filter array element to be used therein may have to undergo rather severe heating and treatment steps during manufacture. For example, a transparent conducting layer, such as indium tin oxide (ITO), is usually vacuum sputtered onto the color filter array element which is then cured and patterned by etching. The curing may take place at temperatures as high as 200° C. for times which may be as long as one hour or more. This is followed by coating with a thin Polymeric alignment layer for the liquid crystals, such as a polyimide, followed by another curing step for up to several hours at an elevated temperature. These treatment steps can be very harmful to many color filter array elements, especially those with a gelatin matrix.

Polycarbonate dye image-receiving layer materials for color filter array elements are described in U.S. Pat. No. 4,962,081. In using these materials to form a color filter array element, the polymeric material is typically coated on a glass support, using spin coating in order to obtain a smooth coating. Alternatively, the image-receiving layer can be applied to the support in a pattern, just slightly larger than the viewing area of the liquid crystal display device, by means of screen printing, as disclosed in U.S. Pat. No. 5,079,214. This and the other patents cited above are incorporated herein by reference.

As has been mentioned, processes for the manufacture of color filter arrays entail the use of high temperatures and a variety of solvents. These conditions can cause severe damage to the polymeric dye image-receiving layers. The present invention provides a polymeric overcoat that protects the image-receiving layer of a color filter array against degradation during the multiple steps of the manufacturing Process.

BRIEF SUMMARY OF THE INVENTION

The color filter array element of the invention comprises a support on which is coated a polymeric dye image-receiving layer containing a thermally transferred image comprising a repeating pattern of colorants and, overlying said transferred image, as a Protective overcoat layer, is a cycloaliphatic epoxide polymer. This protective layer is produced by photopolymerizing an overcoat layer containing a cycloaliphatic epoxide compound and, as a polymerization initiator, an onium salt of a Lewis acid. In a preferred embodiment, the cycloaliphatic epoxide compound is 3,4-epoxycyclohexylmethyl-3,4-epoxy-cyclohexylmethylcarboxylate. The protective overcoat layer that is formed by irradiation of the photopolymerizable overcoat layer with ultraviolet radiation protects the dyes and image-receiving layer from damage from solvents, butyrolactone for example, used in coating the alignment layer for the conducting layer in liquid crystal displays. Without such a protective overcoat, the dyes are attacked by the solvent, resulting in loss of density and smearing of the image. The protective overcoat in the color filter array element of the invention maintains the good sharpness and high quality of the pattern of colorants in the element.

The method of the invention comprises imagewise heating a dye-donor element comprising a support having thereon a dye layer, said donor element being in contact with a dye receiving element comprising a transparent support having thereon a polymeric dye image-receiving layer; and thereby transferring portions of said dye layer to said dye receiving element to form a repeating mosaic pattern of dyes thereon; coating over said pattern of dyes on said dye receiving element a photopolymerizable overcoat layer containing a cycloaliphatic epoxide compound and, as a polymerization initiator, an onium salt of a Lewis acid; and irradiating said photopolymerizable layer with ultraviolet radiation to form a protective overcoat layer.

DETAILED DESCRIPTION OF THE INVENTION

Figure 1:
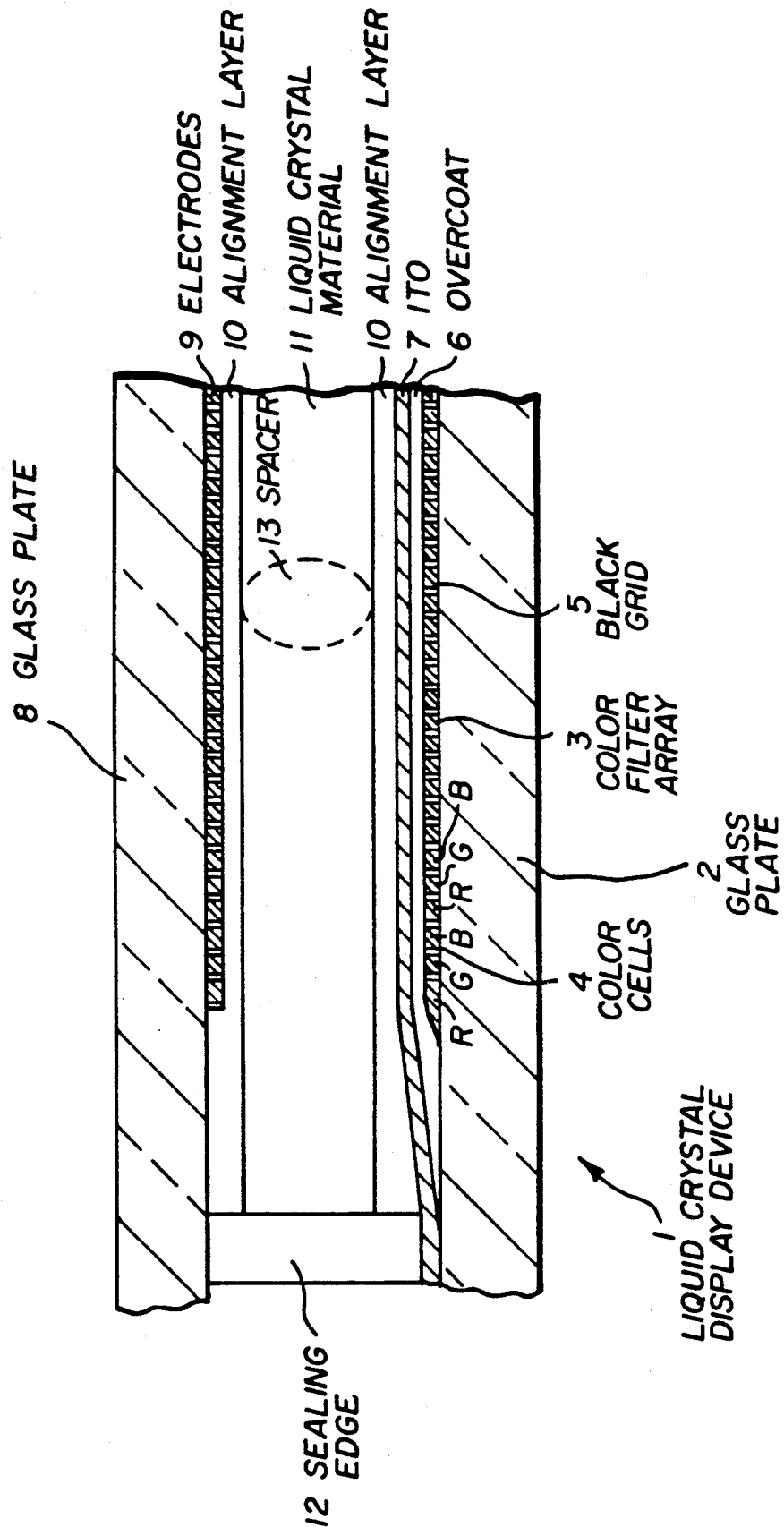

As noted above, the dye image-receiving layer contains a thermally transferred image comprising a repeating pattern of colorants in the polymeric dye image-receiving layer, preferably a mosaic pattern.

In a preferred embodiment of the invention, the mosaic pattern consists of a set of red, green and blue additive primaries.

In another preferred embodiment of the invention, each area of primary color and each set of primary colors are separated from each other by an opaque area, e.g., black grid lines. This has been found to give improved color reproduction and reduce flare in the displayed image.

The size of the mosaic set is not critical since it depends on the viewing distance. In general, the individual pixels of the set are from about 50 to about 600 μm and do not have to be of the same size.

In a preferred embodiment of the invention, the repeating mosaic pattern of dye to form the color filter array element consists of uniform, square, linear repeating areas, with one color diagonal displacement as follows:

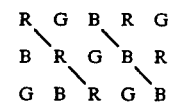

In another preferred embodiment, the above squares are approximately 100 μm.

The color filter array elements prepared according to the invention can be used in image sensors or in various electro-optical devices such as electroscopic light valves or liquid crystal display devices. Such liquid crystal display devices are described, for example, in UK Patents 2,154,355; 2,130,781; 2,162,674 and 2,161,971.

Liquid crystal display devices are commonly made by placing a material, which is liquid crystalline at the operating temperature of the device, between two transparent electrodes, usually indium tin oxide coated on a substrate such as glass, and exciting the device by applying a voltage across the electrodes. Alignment layers are provided over the transparent electrode layers on both substrates and are treated to orient the liquid crystal molecules in order to introduce a twist of, e.g., 90°, between the substrates. Thus, the plane of polarization of plane polarized light will be rotated in a 90° angle as it passes through the twisted liquid crystal composition from one surface of the cell to the other surface. Application of an electric field between the selected electrodes of the cell causes the twist of the liquid crystal composition to be temporarily removed in the portion of the cell between the selected electrodes. By use of optical polarizers on each side of the cell, polarized light can be passed through the cell or extinguished, depending on whether or not an electric field is applied.

The polymeric alignment layer described above can be any of the materials commonly used in the liquid crystal art. Examples of such materials include polyimides, polyvinyl alcohol and methyl cellulose.

The transparent conducting layer described above is also conventional in the liquid crystal art. Examples of such materials include indium tin oxide, indium oxide, tin oxide and cadmium stannate.

The Figure shows diagrammatically a part of liquid crystal display device 1 having a plate 2 of glass, quartz, or other suitable material. A color filter array 3 comprises red (R), green (G) and blue (B) cells 4 corresponding to pixels. Black grid lines 5 separate each color cell. The color filter array 3 is provided with an overcoat layer 6 and a transparent conducting layer of ITO 7.

In the color filter array of the invention the polymeric overcoat layer 6, which overlies the image-receiving layer that contains the transferred dye image, is formed by photopolymerizing a layer containing a cycloaliphatic epoxide compound such as 3,4-epoxycyclohexylmethyl-3,4-epoxycyclohexylcarboxylate and an onium salt of a Lewis acid as a photoinitiator, as described more fully hereinafter. In the Figure the polymeric protective overcoat layer is depicted extending beyond the viewing area of the liquid crystal display device. However said polymeric overcoat layer can be coextensive with the underlying transferred dye image in the receiving layer.

The other plate 8 has electrodes 9 provided thereon which define pixels, either because the electrodes 9 and the transparent conducting layer of ITO 7 constitute a cross-bar system in which the crossings define the pixels (passive drive), or because the electrodes 9 constitute picture electrodes which are driven by a system (not shown) of switching elements, drive and data lines (active drive), in which case the electrodes 9 may have a single flat structure.

A layer of liquid crystal material 11, which is provided with alignment layers 10, is present between the two supporting plates 2 and 8. The two plates are held at a substantially constant distance from each other by means of a sealing edge 12 and spacers 13. In practice, the device is further provided with polarizers, reflectors, etc. in the conventional manner.

The dye image-receiving layer used in forming the color filter array element of the invention may comprise, for example, those polymers described in U.S. Pat. Nos. 4,695,286, 4,740,797 and 4,775,657, and 4,962,081, the disclosures of which are hereby incorporated by reference. In a preferred embodiment, polycarbonates having a glass transition temperature greater than about 200° C. are employed. In another preferred embodiment, polycarbonates derived from a methylenesubstituted bisphenol A such as 4,4'-(hexahydro-4,7-methanoindan-5-ylidene)-bisphenol are employed. In general, good results have been obtained at a coverage of from about 0.25 to about 5 mg/m².

The support used in the invention is preferably glass such as borax glass, borosilicate glass, chromium glass, crown glass, flint glass, lime glass, potash glass, silica-flint glass, soda glass, and zinc-crown glass. In a preferred embodiment, borosilicate glass is employed.

A dye-donor element that is used to form the color filter array element of the invention comprises a support having thereon a dye layer. Any dye or mixture of dyes can be used in such a layer provided they are transferable to the dye image-receiving layer of the color array element of the invention by the action of heat. Especially good results have been obtained with sublimable dyes. Examples of sublimable dyes include anthraquinone dyes, e.g., Sumikalon Violet RS ® (Sumitomo Chemical Co., Ltd.), Dianix Fast Violet 3R-FS ® (Mitsubishi Chemical Industries, Ltd.), and Kayalon Polyol Brilliant Blue N-BGM ® and KST Black 146 ® (Nippon Kayaku Co., Ltd.); azo dyes such as Kayalon Polyol Brilliant Blue BM ®, Kayalon Polyol Dark Blue 2BM ®, and KST Black KR ® (Nippon Kayaku Co., Ltd.), Sumickaron Diazo Black 5G ® (Sumitomo Chemical Co., Ltd.), and Miktazol Black 5GH ® (Mitsui Toatsu Chemicals, Inc.); direct dyes such as Direct Dark Green B ® (Mitsubishi Chemical Industries, Ltd.) and Direct Brown M ® and Direct Fast Black D ® (Nippon Kayaku Co. Ltd.); acid dyes such as Kayanol Milling Cyanine 5R ® (Nippon Kayaku Co. Ltd.); basic dyes such as Sumicacryl Blue 6G ® (Sumitomo Chemical Co., Ltd.), and Aizen Malachite Green ® (Hodogaya Chemical Co., Ltd.); or any of the dyes disclosed in U.S. Pat. Nos. 4,541,830, 4,698,651, 4,695,287, 4,701,439, 4,757,046, 4,743,582, 4,769,360 and 4,753,922, the disclosures of which are hereby incorporated by reference.

Suitable dyes are further illustrated by the following structural formulas:

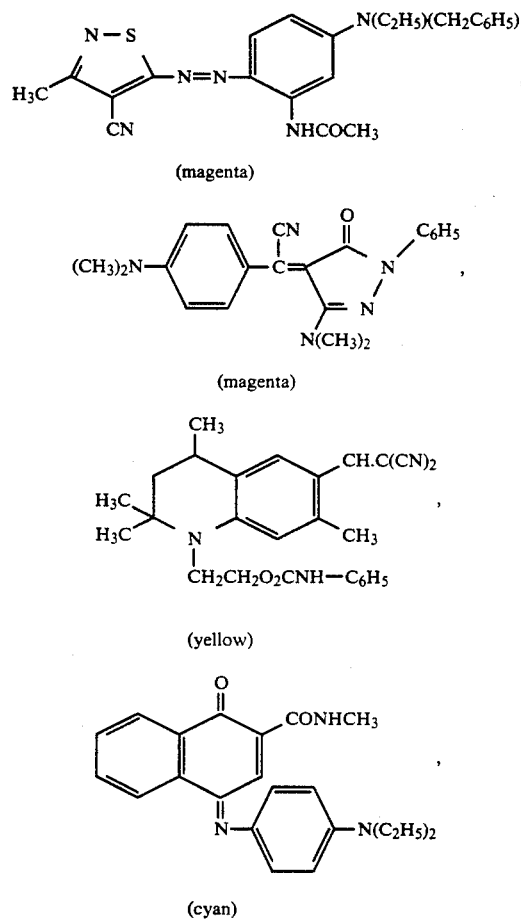

(magenta)

(magenta)

(yellow)

(cyan)

The above subtractive dyes can be employed in various combinations to obtain the desired red, blue and green additive primary colors, as disclosed in U.S. Pat. Nos. 4,957,898, 4,975,410, and 4,988,665, the disclosures of which are hereby incorporated by reference. The dyes can be mixed within the dye layer or transferred sequentially if coated in separate dye layers and can be used at a coverage of from about 0.05 to about 1 g/m².

Various methods can be used to transfer dye from the dye donor to the image-receiving layer on the support to form the color filter array element of the invention. For example, a high intensity light flash technique can be used with a dye-donor containing an energy absorptive material such as carbon black or a light-absorbing dye. Such a donor can be used in conjunction with a mirror which has a grid pattern formed by etching with a photoresist material. This method is described more fully in U.S. Pat. No. 4,923,860, incorporated herein by reference.

Another method of transferring dye from the dye-donor to the transparent support to form the color filter array element of the invention is to use a heated embossed roller as described more fully in U.S. Pat. No. 4,978,652, incorporated herein by reference.

In another embodiment of the invention, the imagewise-heating is done by means of a laser, using a dye-donor element comprising a support having thereon a dye layer and an absorbing material for the laser. Whichever of these known thermal dye transfer methods is selected for making the color filter array element of the invention, the imagewise heating causes the dyes to transfer and form a repeating mosaic pattern of colorants in the receiving layer.

Any material that absorbs the laser energy or high intensity light flash described above can be used as the absorbing material, for example, carbon black or nonvolatile infrared-absorbing dyes or pigments which are well known to those skilled in the art. In a Preferred embodiment, cyanine infrared absorbing dyes are employed as described in U.S. Pat. No. 4,973,572, the disclosure of which is hereby incorporated by reference.

After the dyes are transferred to the receiver, the image can be treated to further diffuse the dye into the dye-receiving layer in order to stabilize the image. This can be done by radiant heating, solvent vapor, or by contact with heated rollers. The fusing step aids in Preventing fading and surface abrasion of the image upon exposure to light and also tends to prevent crystallization of the dyes. Solvent vapor fusing can also be used instead of thermal fusing.

After the color filter array has been prepared by transfer of the dyes to the image-receiving layer, a photopolymerizable overcoat is applied, using a formulation that contains the cycloaliphatic epoxide 3,4-epoxycyclohexylmethyl-3,4-epoxycyclohexylcarboxylate and a photoinitiator, which preferably is an onium salt of a Lewis acid, for example, a triarylsulfonium salt. The color filter array element is then irradiated with ultraviolet radiation to produce the protective polymeric overcoat of the invention.

Although even small amounts of the cycloaliphatic epoxide compound and of the photoinitiator in the photopolymerizable overcoat formulation can produce a polymeric layer that provides significant protection of dyes in the image-receiving layer against attack by organic solvents, the photopolymerizable overcoat formulation preferably contains at least about 25 weight percent of the cycloaliphatic epoxide compound and at least about 4 weight percent of the photoinitiator. Especially excellent protection is obtained with high concentrations, at least about 95 weight percent of the epoxide. An overcoat layer applied at only 2 µm thickness provides excellent protection of dyes in the image-receiving layer, and even thinner overcoats are effective against attack of the dyes by solvents. The photopolymerizable overcoat layer can be applied to the support by spin coating; alternatively, it can be applied over the image-receiving layer in a pattern, slightly larger than the viewing area of the liquid crystal display device, by a printing method such as flexographic printing, according to the process described in NL Application 90.00389, filed Feb. 2, 1990.

Especially useful photoinitiators in accordance with the invention include Cyracure UVI-6974 ® triarylsulfonium hexafluoroantimonate and Cyracure UvI-6990 ® triarylsulfonium hexafluorophosphate, both products of Union Carbide Company. Other useful photoinitiators are disclosed in U.S. Pat. Nos. 4,161,478, 4,374,066, and 4,684,671, the disclosures of which are herein incorporated by reference.

In addition to the epoxide compound and the photoinitiator, the overcoat layer of the invention can contain additional solvents and diluents such as ethers, for example, 1,4-butanediol diglycidyl ether, bisphenol A diglycidyl ether, and the like.

The color filter array element which has been irradiated with ultraviolet radiation to produce the protective polymeric overcoat of the invention can be subjected to a further step of heating in an oven before testing.

A series of examples of overcoated elements which demonstrate the effectiveness of cycloaliphatic epoxide polymers as overcoats and a series of controls have been prepared and tested as described below.

GENERAL METHOD FOR FORMING THE ELEMENTS

Color filter array model samples represented by a "red only dye" area were prepared by first spin coating a 0.1% solution of VM651 ® siloxane adhesion promoter (a product of Dupont) in a mixture of 95% methanol and 5% distilled water onto a piece of clean glass for 2 minutes at 1000 rpm. The adhesion promoting layer had a thickness of less than 0.1 µm. Next, a 12% solution of the receiver polymer 4,4'-(hexahydro-4,7-methanoindan-5-ylidene)bisphenol polycarbonate in cyclohexanone was spin coated over the adhesion promoting layer by spinning for 2 minutes at 1000 rpm. The dye receiving layer had a thickness of ~3.5 µm. The coated samples were then heated in an oven for one hour at 90° C. The samples were imaged by a flash technique transferring a 1.2×4.2 cm patch of red dye with a Metz Model 402 flash unit (manufactured by Metz AG), using a mirror box as described in U.S. Pat. No. 4,957,898, incorporated herein by reference. The flash delivered 11 J/cm$^2$ of energy.

The formulation of the red dye-donor used was as follows:

0.22 g/m$^2$ Yellow dye A of U.S. Pat. No. 4,957,898 (incorporated herein by reference)

0.26 g/m$^2$ Magenta dye I of U.S. Pat. No. 4,957,898 (incorporated herein by reference)

0.25 g/m$^2$ Raven 1255 ® carbon, dispersed in 2-butanone and cellulose acetate propionate 0.20 g/m$^2$ Cellulose acetate propionate (2.5% acetyl, 46% propionyl)

0.008 g/m$^2$ Fluorad FC-431 ® fluorosurfactant (a product of 3M Corp.)

0.028 g/m$^2$ Solsperse 24000 ® aminepolyester surfactant (a product of ICI Corp.)

It was coated from a mixture of 30% 2-butanone, 30% cyclopentanone, 20% toluene, and 20% propyl alcohol onto polyethylene terephthalate film support of 100 µm thickness.

The dye was transferred from the donor coating into the receiving layer using the flash transfer method previously described. The dye-donor sheet was then removed from the receiver sheet. After the flash transfer process, substantially all of the transferred dye was on the surface of the receiving layer. To fuse the dye into the receiving layer, the entire glass plate was exposed to saturated acetone vapor for five minutes and then Placed for one minute under a Pyro panel lamp Model 5610 (from Research Inc.), set to produce a temperature of 210° C. After fusing, the samples were wiped with methanol to ensure there was no dye remaining on the surface of the receiving layer.

A UV-curable overcoat was then applied to the receiver layer containing the red dye image by spin coating a solution of epoxide compound and photoinitiator composition, as employed in the elements of the invention, for 2 minutes at a speed (from 1000 to 7000 rpm) to produce the desired thickness. The overcoat was then subjected to ultraviolet radiation for 5 minutes from a Model M-218 exposing unit (from Colight Inc.), which has a medium pressure mercury lamp whose major wavelengths are 366 nm and 405 nm. After exposure the samples were heated in an oven for 15 minutes at 60° C. and then for 15 minutes at 200° C. The overcoated samples were then allowed to stand for at least 24 hours before further testing.

All of the formulations of the polymerizable overcoat contained Cyracure UVR-6110® 3,4-epoxycyclohexylmethyl-3,4-epoxycyclohexylcarboxylate and Cyracure UVI-6974® triarylsulfonium hexafluoroantimonate; both materials are products of Union Carbide Co.

Method of Testing

The following procedure was used to test the UV-irradiated overcoated samples for butyrolactone resistance. A 10% solution in butyrolactone of Matrimid 5218® polyimide (from Ciba-Geigy), a material that has been described (Bahadur, B., *Liquid Crystal Displays;* Dienes, G. J., Labes M. M., Brown, G. H., Eds; "Molecular Crystals and Liquid Crystals"; Gordon & Beach Science Publishers Inc., New York, 1984) as useful as an alignment layer for liquid crystal displays, was applied to an imaged color filter array sample.

After two minutes contact with the butyrolactone solution of polyimide, the sample was spun with a spin coater for two minutes at 3000 rpm. The sample so treated was placed in a 175° C. oven for 15 minutes, then removed and evaluated for defects by visual inspection.

Before the overcoating process, the blue and green Status A transmission densities were read at three areas on each color filter array model sample and averaged. After the test for butyrolactone resistance, three density readings were again made and averaged for each sample The percent loss of density, which corresponds to dye loss resulting from contact with butyrolactone, was then calculated. The average density readings, the calculated percent dye loss, and the appearance of the samples after the butyrolactone test are shown in the Table following the specific examples below.

The specific examples that follow illustrate variations, in accordance with the invention, of the conditions and compositions for the application of the overcoat to the red dye containing receiving layer, as described in the above general procedure.

EXAMPLE 1

A solution of 96% by weight 3,4-epoxycyclohexylmethyl-3,4-epoxycyclohexylcarboxylate and 4% by weight triarylsulfonium hexafluoroantimonate was spin coated on the red dye-containing receiving layer, giving an overcoat with a thickness of 2.0 μm. The sample was UV-irradiated, and subjected to the butyrolactone resistance test. Transmission density readings showed zero blue density loss and only 5 percent green density loss, illustrating the excellent protection by the polymeric overcoat of the red dye in the receiving layer from attack by butyrolactone.

EXAMPLE 2

The procedure of Example 1 was followed, except that the spin coating speed was adjusted to produce an overcoat with a thickness of 3.3 μm. After the butyrolactone resistance test, there was zero blue density loss and only 5% green density loss, again demonstrating the excellent protection of the red dye-containing receiving layer by the polymeric overcoat.

EXAMPLE 3

The procedure of Example 1 was followed, except that the spin coating speed was adjusted to produce an overcoat with a thickness of 6.3 μm. After the butyrolactone resistance test, zero loss in both blue and green densities was observed.

EXAMPLE 4

The procedure of Example 1 was followed, except that the spin coating speed was adjusted to produce an overcoat with a thickness of 10.5 μm. After the butyrolactone resistance test, there was 6% loss in blue density, zero loss in green density.

EXAMPLE 5

The procedure of Example 1 was followed, except that the spin coating speed was adjusted to produce an overcoat with a thickness of 14.8 μm. After the butyrolactone resistance test, there was zero loss in both blue and green densities.

EXAMPLE 6

The procedure of Example 1 was followed, except that the spin coating speed was adjusted to produce an overcoat with a thickness of 19.0 μm. After the butyrolactone resistance test, zero loss in both blue and green densities was observed.

EXAMPLE 7

A solution of 71% by weight 3,4-epoxycyclohexylmethyl-3,4-epoxycyclohexylcarboxylate, 4% by weight triarylsulfonium hexafluoroantimonate, and 25% by weight Araldite GY6010® bisphenol A diglycidyl ether (from Ciba-Geigy) was spin coated on the red dye-containing receiving layer, giving an overcoat with a thickness of 3.3 μm. The sample was UV-irradiated and subjected to the butyrolactone resistance test. Transmission density readings showed only 5% blue density loss and zero green density loss.

EXAMPLE 8

The procedure of Example 7 was followed, except that the overcoat formulation consisted of 25% by weight 3,4-epoxycyclohexylmethyl-3,4-epoxycyclohexylcarboxylate, 4% by weight triarylsulfonium hexafluoroantimonate, and 71% by weight 1,4-butanediol diglycidyl ether. After the butyrolactone resistance test, the blue density loss was only 6% and the green density loss was 10%. This illustrates the good protection of the red dye in the receiving layer by an overcoat whose formulation contained only 25% of the cycloaliphatic epoxy compound.

EXAMPLE 9

The procedure of Example 7 was followed, except that the overcoat formulation consisted of 46% by weight 3,4-epoxycyclohexylmethyl-3,4-epoxycyclohexylcarboxylate, 4% by weight triarylsulfonium hexafluoroantimonate, and 50% by weight 1,4-butanediol diglycidyl ether. After the butyrolactone resistance test there was zero blue density loss and only 5% green density loss.

EXAMPLE 10

The procedure of Example 7 was followed, except that the overcoat formulation consisted of 75% by weight 3,4-epoxycyclohexylmethyl-3,4-epoxycyclohexylcarboxylate, 4% weight triarylsulfonium hexafluoroantimonate and 21% by weight 1,4-butanediol diglycidyl ether. After the butyrolactone resistance test, a blue density loss of 6% and a green density loss of 10% were observed.

Following are descriptions of control tests which demonstrate the superiority of the elements of the invention.

Control A an overcoat whose formulation contained none of the cycloaliphatic epoxy compound.

Control D

A solution of 73% by weight 3,4-epoxycyclohexylmethyl-3,4-epoxycyclohexylcarboxylate, 23% by weight HY283® polyamide hardener (from Ciba Geigy), and 4% by weight monoethylamine trifluoroboride complex was spin coated on the red dye-containing receiving layer, giving an overcoat with a thickness of 3.3 μm. The sample was not UV-irradiated but was instead heated at 120° C. for 15 minutes, then at 150° C. for 15 minutes, and finally at 200° C. for 30 minutes. After the butyrolactone resistance test, the blue density loss was 72% and the green density loss was 70%. Comparing this result with that in Control A shows that the heat-cured overcoat of this example afforded little more protection of the red dye in the receiving layer than no overcoat at all.

The following Table summarizes the compositions and test results of the above examples and controls.

TABLE

| Example | CE* | IN** | Overcoat Thickness (μm) | OVERCOAT PERFORMANCE Status A Transmission Densities | | | | | | Effect on Red Dye Image |
|---|---|---|---|---|---|---|---|---|---|---|
| | | | | Blue | | | Green | | | |
| | | | | Before‡ | After‡‡ | % Change | Before‡ | After‡‡ | % Change | |
| 1 | 96 | 4 | 2.0 | 1.9 | 1.9 | 0 | 2.1 | 2.0 | −5 | None |
| 2 | 96 | 4 | 3.3 | 1.9 | 1.9 | 0 | 2.1 | 2.0 | −5 | None |
| 3 | 96 | 4 | 6.3 | 2.0 | 2.0 | 0 | 2.2 | 2.2 | 0 | None |
| 4 | 96 | 4 | 10.5 | 1.8 | 1.7 | −6 | 1.9 | 1.9 | 0 | None |
| 5 | 96 | 4 | 14.8 | 1.9 | 1.9 | 0 | 2.0 | 2.0 | 0 | None |
| 6 | 96 | 4 | 19.0 | 1.9 | 1.9 | 0 | 2.1 | 2.1 | 0 | None |
| 7 | 71 | 4 | 3.3 | 1.9 | 1.8 | −5 | 2.0 | 2.0 | 0 | None |
| 8 | 25 | 4 | 3.3 | 1.8 | 1.7 | −6 | 2.0 | 1.8 | −10 | None |
| 9 | 46 | 4 | 3.3 | 1.7 | 1.7 | 0 | 1.9 | 1.8 | −5 | None |
| 10 | 75 | 4 | 3.3 | 1.8 | 1.7 | −6 | 2.0 | 1.8 | −10 | None |
| Control A | 0 | 0 | — | 1.7 | 0.3 | −82 | 1.9 | 0.3 | −84 | Destroyed |
| Control B | 100 | 0 | 3.3 | 1.9 | 1.4 | −26 | 2.1 | 1.6 | −24 | Slightly Wrinkled |
| Control C | 0 | 4 | 3.3 | 1.9 | 0.9 | −53 | 2.1 | 1.1 | −48 | Wrinkled and Smeared |
| Control D | 73 | 0 | 3.3 | 1.8 | 0.5 | −72 | 2.0 | 0.6 | −70 | Cracked |

*% cycloaliphatic epoxide in overcoat formulation
**% sulfonium salt initiator in overcoat formulation
‡transmission density before overcoat application
‡‡transmission density after butyrolactone resistance test The red dye-containing receiving layer coating, without an overcoat, was subjected to the butyrolactone resistance test. Transmission density readings showed an 82% loss of blue density and an 84% loss of green density, which is evidence of severe attack by butyrolactone on the red dye in the receiving layer.

Control B

The procedure of Example 7 was followed, except that the overcoat formulation was 100% 3,4-epoxycyclohexylmethyl-3,4-epoxycyclohexylcarboxylate. After the butyrolactone resistance test, there was a 26% blue density loss and a 24% green density loss. This result, compared with that obtained in Example 1, shows the much inferior protection of the red dye in the receiving layer afforded by an overcoat whose formulation contained no photoinitiator.

Control C

The procedure of Example 7 was followed, except that the overcoat formulation contained 4% by weight triarylsulfonium antimonate and 96% by weight 1,4-butanediol diglycidyl ether. After the butyrolactone resistance test, a 53% blue density loss and a 48% green density loss were observed. This result demonstrates the poor protection of the red dye in the receiving layer by The results listed in the Table above demonstrate that the overcoat layers in the elements of the invention that are prepared from formulations that contain at least 25% of the cycloaliphatic epoxide compound and 4% of the photoinitiator compound substantially protected the dye in the receiving layer against attack by organic solvents. In contrast, the controls were destroyed or damaged.

The invention has been described in detail with particular reference to preferred embodiments thereof, but it will be understood that variations and modifications can be effected within the spirit and scope of the invention.

We claim:

1. A color filter array element comprising a support having thereon a polymeric dye image-receiving layer containing a thermally transferred image comprising a repeating pattern of colorants and, overlying said transferred image as a protective overcoat layer, a cycloaliphatic epoxide polymer.

2. An element of claim 1 wherein said protective overcoat layer results from polymerization of a layer containing at least about 25 weight percent of a cycloaliphatic epoxide compound and at least about 4 weight percent of an initiator which is an onium salt of a Lewis acid.

3. An element of claim 2 wherein said cycloaliphatic epoxide compound is 3,4-epoxycyclohexylmethyl-3,4-epoxycyclohexylcarboxylate.

4. The element of claim 2 wherein said onium salt is a triarylsulfonium hexafluoroantimonate or a triarylsulfonium hexafluorophosphate.

5. The element of claim 1 which is adapted for use in a color electro-optical display device.

6. The element of claim 5 further comprising a transparent conducting layer over said transferred image and a polymeric alignment layer over said conducting layer.

7. The element of claim 6 wherein said polymeric alignment layer contains a polyimide coated from a butyrolactone solution.

8. The element of claim 1 wherein said polymeric dye image-receiving layer comprises a polycarbonate having a glass transition temperature greater than about 200° C.

9. The element of claim 8 wherein said polycarbonate is derived from 4,4'-(hexahydro-4,7-methanoindan-5-ylidene)bisphenol.

10. The element of claim 1 wherein said pattern is a mosaic pattern of a set of red, green, and blue additive primary colorants.

11. The element of claim 1 wherein said thermally transferred image comprises one or more sublimable dyes.

12. The element of claim 1 wherein said support is glass.

13. The element of claim 1 wherein said protective overcoat layer contains 1,4-butanediol diglycidyl ether or bisphenol A diglycidyl ether.

14. A method of forming a color filter array element which comprises (a) imagewise heating a dye-donor element comprising a support having thereon a dye layer, said donor element being in contact with a dye-receiving element comprising a transparent support having thereon a polymeric dye image-receiving layer, and thereby (b) transferring portions of said dye layer to said dye-receiving element to form a repeating mosaic pattern of dyes thereon, (c) coating over said pattern of dyes on said dye-receiving element a Photopolymerizable overcoat layer containing a cycloaliphatic epoxide compound and, as a polymerization initiator, an onium salt of a Lewis acid, and (d) irradiating said photopolymerizable layer with ultraviolet radiation.

15. The method of claim 14 wherein said photopolymerizable overcoat layer contains at least about 25 weight percent of said cycloaliphatic epoxide compound and at least about 4 weight percent of said initiator.

16. The method of claim 15 wherein said cycloaliphatic epoxide compound is 3,4-epoxycyclohexylmethyl-3,4-epoxycyclohexylcarboxylate.

17. The method of claim 16 wherein said overcoat layer contains at least about 95 weight percent of 3,4-epoxycyclohexylmethyl-3,4-epoxycyclohexylcarboxylate.

18. The method of claim 14 wherein said onium salt is a triarylsulfonium hexafluoroantimonate or a triarylsulfonium hexafluorophosphate.

19. The method of claim 14 wherein said photopolymerizable overcoat layer is coated over the dye-receiving element by spin coating.

20. The method of claim 14 wherein said photopolymerizable overcoat layer is coated over said pattern of dyes by screen printing.

* * * * *